(12) United States Patent
Lackey et al.

(10) Patent No.: US 6,566,681 B2
(45) Date of Patent: May 20, 2003

(54) APPARATUS FOR ASSISTING BACKSIDE FOCUSED ION BEAM DEVICE MODIFICATION

(75) Inventors: David E. Lackey, Jericho, VT (US); Theodore M. Levin, Burlington, VT (US); Leah M. Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/908,925

(22) Filed: Jul. 19, 2001

(65) Prior Publication Data

US 2003/0015671 A1 Jan. 23, 2003

(51) Int. Cl.$^7$ .......................... H01L 23/58; H01L 23/48
(52) U.S. Cl. ............................... 257/48; 257/778
(58) Field of Search ..................... 257/48, 778

(56) References Cited

U.S. PATENT DOCUMENTS

| | | |
|---|---|---|
| 5,140,164 A | 8/1992 | Talbot et al. |
| 5,208,178 A | 5/1993 | Usami |
| 5,483,490 A | 1/1996 | Iwai et al. |
| 5,504,340 A | 4/1996 | Mizumura et al. |
| 5,583,344 A | 12/1996 | Mizumura et al. |
| 5,821,549 A | 10/1998 | Talbot et al. |
| 5,844,416 A | 12/1998 | Campbell et al. |
| 5,892,249 A | 4/1999 | Courtright et al. |
| 5,904,486 A | 5/1999 | Livengood et al. |
| 5,976,980 A | 11/1999 | Livengood et al. |
| 6,020,746 A | 2/2000 | Livengood |
| 6,069,079 A | 5/2000 | Li |
| 6,107,106 A | 8/2000 | Mori |

FOREIGN PATENT DOCUMENTS

| | | |
|---|---|---|
| JP | 0295065 A3 | 12/1988 |
| JP | 3-138955 | 6/1991 |

*Primary Examiner*—Kamand Cuneo
*Assistant Examiner*—Scott B Geyer
(74) *Attorney, Agent, or Firm*—Richard A. Henkler; Bracewell & Patterson, L.L.P.

(57) ABSTRACT

An apparatus for assisting backside focused ion beam (FIB) device modification is disclosed. The apparatus for assisting backside FIB device modification includes an FIB device modification circuit and a control circuit. The FIB device modification circuit includes an input, an output, an FIB input pad, and an FIB output pad. The FIB device modification circuit allows the input to be electrically connected to the output. The control circuit, which is coupled to the FIB device modification circuit, may include a jumper and a cut. The control circuit is preferably located in a proximity of a backside of a substrate to allow the jumper and the cut to be modified by an FIB machine.

8 Claims, 5 Drawing Sheets

APPARATUS FOR ASSISTING BACKSIDE FOCUSED ION BEAM DEVICE MODIFICATION

BACKGROUND OF THE INVENTION

1. Technical Field

The present invention relates to integrated circuits in general, and in particular to an apparatus for assisting device modification. Still more particularly, the present invention relates to an apparatus for assisting backside focused ion beam device modification.

2. Description of the Prior Art

In order to implement physical changes to an integrated circuit, one can modify the masks used to manufacture an integrate circuit, or one can modify it physically by changing the circuit connections within the integrated circuit itself. Modifying masks and manufacturing a new integrated circuit can be costly and time consuming. Although attempting to rewire or make other edits to the integrate circuit can also be a time consuming process, it offers the chance to verify changes to the integrated circuit in hardware without the delays and costs associated with remanufacturing. Typically, one determines the best approach to modify the circuit by selecting circuits and conductive lines within the integrated circuit that are accessible and allow the desired modification to be made. Then, one must perform cuts and connections to form the necessary interconnections between the selected circuits. Such modifications, or edits, are commonly formed using a focused ion beam (FIB) machine. A FIB machine is capable of adding or removing both conductive and insulative materials in an integrated circuit. Removing conductive material produces an opening, known as an "insulation cut." Filling a hole with conductive material creates a "metal via" that can be used to re-route electrical connections. Removal of insulative material is used to access conductors and circuits of interest, whereas deposition of insulative material is used to shield conductors and circuits from unwanted electrical connection.

Nevertheless, editing an integrated circuit with a FIB machine itself can be prohibitive; FIB machine capabilities may not be compatible with advanced semiconductor technology fabrication techniques, geometry, and materials. Typically, one makes FIB modifications from the front or wiring side of the integrated circuit. However, the multi-layer wiring in integrated circuits prevents the necessary FIB modifications from being made since the higher-lying wiring layers obscure access to the wires that are to be modified. An attempt to access the circuits and wires of interest would damage the overlying wiring, degrading circuit performance or even rendering the circuit completely non-functional. Additionally, the dimensions of a FIB cut or deposition, and the extra clearances required for such cuts and depositions may be larger than the dimensions and clearances in the existing circuit. For example, a deposited via with a width of 0.5 microns is too wide to fit between diffusions that are spaced 0.3 microns apart. There are also material constraints associated with the chemistry used in FIB depositions and the resultant physical properties of the FIB-deposited material. Even if there is sufficient access from the front side, and there are no limiting geometrical constraints, the interaction between the ion beam and the chemicals used in the FIB machine may prevent successful FIB editing. For example, a FIB machine can deposit reliably a conductive line having a length of less than 500 microns. The limitation is imposed because of voiding within the deposited conductor and the high resistivity of the resultant line. Another example, is the affect of ion implantation that occurs as a side effect of using a FIB. These ions can alter the electrical properties of the integrated circuit after FIB edits are complete. Finally, there are resolution and accuracy issues associated with navigation and focused ion beam placement that can limit the effectiveness of FIB edits.

Because of the aforementioned constraints, and the growing prevalence of so-called "flip-chip" packaging, making FIB edits through the silicon substrate on which the integrated circuit is built becomes important. Such processes in which the edits are made in such a manner are termed "backside FIB," and the substrate side of the integrated circuit is referred to as the "back" side. However, making FIB edits from the back side is limited by some of the same constraints described for frontside FIB. Specifically, there are similar geometrical constraints associated with the closely spaced wires and diffusions and the inability to deposit material with the necessary physical properties. Furthermore, new circuit technologies including so-called "low-k" dielectrics and silicon-on-insulator technology pose other constraints on backside FIB methods and materials. Therefore, new structures and methods are needed to incorporate the capacity for FIB editing in state-of-the-art integrated circuits.

SUMMARY OF THE INVENTION

In accordance with a preferred embodiment of the present invention, an apparatus for assisting backside focused ion beam (FIB) device modification circuit includes a FIB control circuit and a FIB device modification circuit. The FIB control circuit, which is coupled to the FIB device modification circuit, contains FIB accessible structures. The FIB control circuit is preferably located in a proximity of a backside of a substrate to allow a FIB machine to edit the structures creating an electrical connection jumper) and/or an insulation cut. The FIB control circuit includes at least one control line for controlling the FIB device modification circuit. The state or control level of the control line is changed when the jumper and/or cut is connected and/or severed by the FIB machine. The FIB device modification circuit includes a control input from the FIB control circuit, an output, and may include an input, a FIB input pad, and a FIB output pad. When the FIB device modification circuit has a control line, an output, and no input, the circuit electrically modifies drive strength on the output. When the FIB device modification circuit has a control line, an input and an output, the circuit allows the input to be electrically connected to the output.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
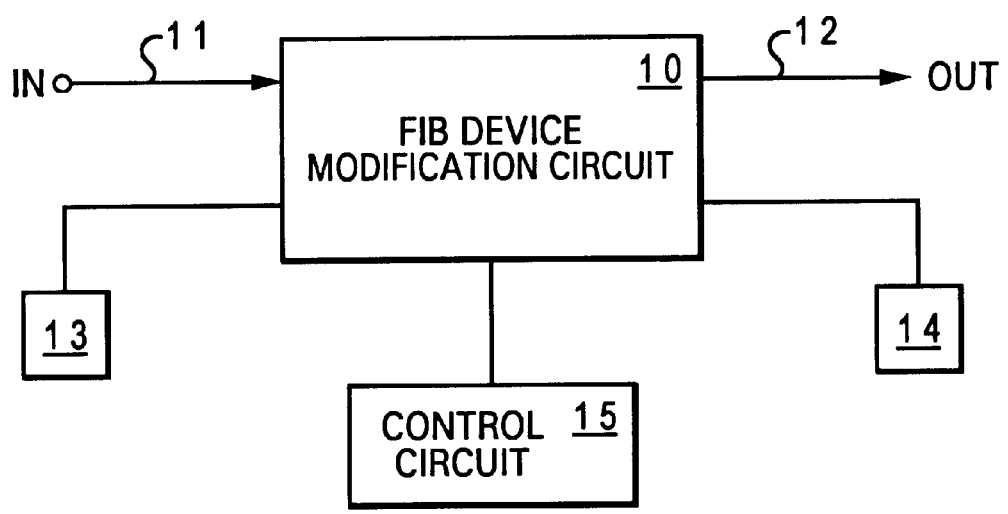
FIG. 1 is a block diagram of an apparatus for assisting backside FIB device modification, in accordance with a preferred embodiment of the invention.

Referring now to the drawings and in particular to FIG. 1, there is depicted a block diagram of an apparatus for assisting backside focus ion beam (FIB) device modification, in accordance with a preferred embodiment of the invention. As shown, a FIB device modification circuit 10 includes an input 11, an output 12, a FIB input pad 13, and a FIB output pad 14. FIB device modification circuit 10 is controlled by a control circuit 15. FIB output pads 13 and 14 are front-end-of-the-line (FEOL) structures that can be modified by a FIB tool. FEOL is defined as process layers that are accessible from the backside of an integrated circuit with a FIB tool. Such process layers commonly include polysilicon, insulator, diffusion, and may include some wiring levels, such as contact, first metal, and first via. In contrast, back-end-of-the-line (BEOL) is defined as process layers that are not reliably accessible from the backside of an integrated circuit with a FIB tool. Such process layers commonly include global interconnect on upper metal levels. Whether a structure can be used as a FIB pad depends on spacing and size of chip structures, materials, and process technology, and FIB tool capabilities and operator experience. FIB output pads 13 and 14 are part of FIB device modification circuit 10 that has shapes and/or dimensions to provide adequate space for a FIB probe contact.

Preferably, FIB input pad 13, FIB output pad 14, and control circuit 15 are located in the proximity of a backside of a substrate on which an integrated circuit (IC) device is built, and FIB device modification circuit 10 may be located anywhere within the substrate. Input 11 is connected to a first circuit (not shown) within the IC device, and output 12 is connected to a second circuit (not shown) within the IC device. During normal operations, input 11 is electrically connected to output 12. Thus, signals received at input 11 appears at output 12. During wire editing operations, a FIB machine can be utilized to modify the circuits within control circuit 15 such that input 11 is electrically disconnected from output 12. Furthermore, input 11 is re-routed to connect to FIB input pad 13, and output 12 is re-routed to connect to FIB output pad 14.

Figure 2A:
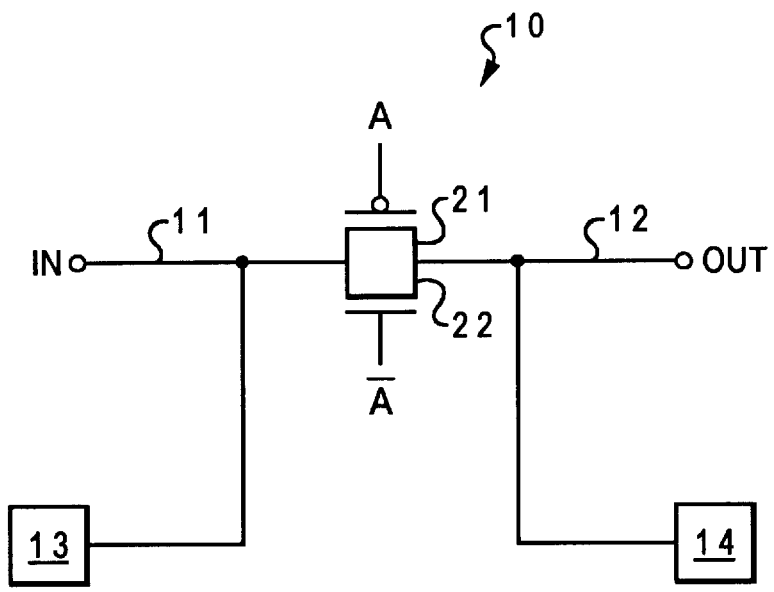
FIG. 2a is a circuit diagram of the FIB device modification circuit from FIG. 1, in accordance with a preferred embodiment of the present invention.

With reference now to FIG. 2a, there is illustrated a circuit diagram of FIB device modification circuit 10 from FIG. 1, in accordance with a preferred embodiment of the present invention. As shown, input 11 is coupled to output 12 via a p-channel transistor 21 and a n-channel transistor 22 connected in parallel. During normal operation, input A=0 and input A=1, and signals received at input 11 appears at output 12 because transistors 21, 22 act as a transmission gate for input 11. Signals to inputs A and $\overline{A}$ are provided by control circuit 15 (from FIG. 1).

Figure 3A:
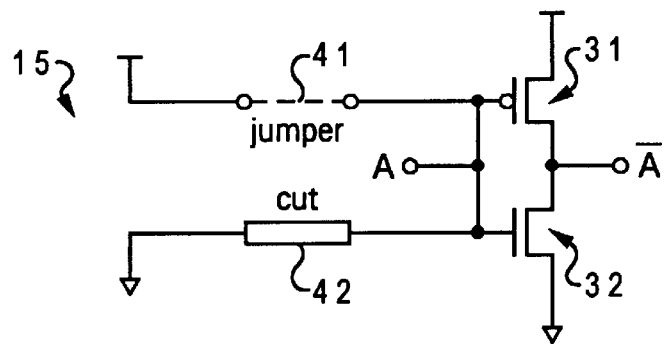
FIG. 3a is a circuit diagram of the control circuit from FIG. 1, in accordance with a preferred embodiment of the present invention.

Referring now to FIG. 3a, there is illustrated a circuit diagram of control circuit 15, in accordance with a preferred embodiment of the present invention. Control circuit 15 includes a p-channel transistor 31 and an n-channel transistor 32 connected in series. During normal operations, input A=0 and input $\overline{A}$=1 because input A is connected to ground and transistors 31, 32 act as an inverter for input A. Both inputs A and $\overline{A}$ are utilized to control transistors 21, 22, respectively, of FIB device modification circuit 10 in FIG. 2a. Control circuit 15 also includes a jumper 41 and a cut 42. Jumper 41 is preferably positioned at the backside of a substrate for FIB jumper connection, such as FIB milled hole(s) filled with metal to provide electrical connection. Cut 42 is also positioned at the backside of the substrate for FIB mill to sever connection, such as a FIB milled hole to cut/break diffusion or poly structure sufficient to provide an electrical open. Because of the locations of jumper 41 and cut 42, FIB edits can be conveniently performed on jumper 41 and cut 42 to change the voltage at inputs A and $\overline{A}$ such that input 11 will be electrically disconnected from output 12 in FIB device modification circuit 10 shown in FIG. 2a. Specifically, during a FIB edit, cut 42 will be disconnected by a FIB isolation cut, and jumper 41 will be connected by a FIB deposit. As a result, A=1 and $\overline{A}$=0 because input A will now be connected to a power supply.

Figure 3B:
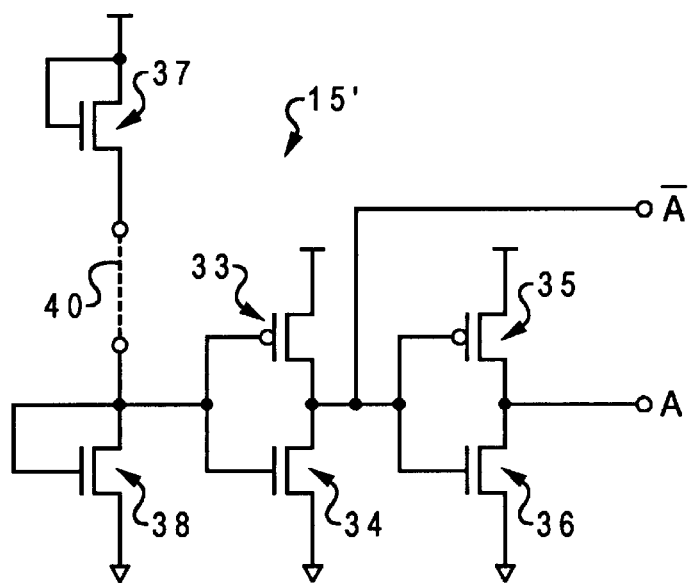
FIG. 3b is a circuit diagram of the control circuit from FIG. 1, in accordance with a second embodiment of the present invention.
Figure 3C:
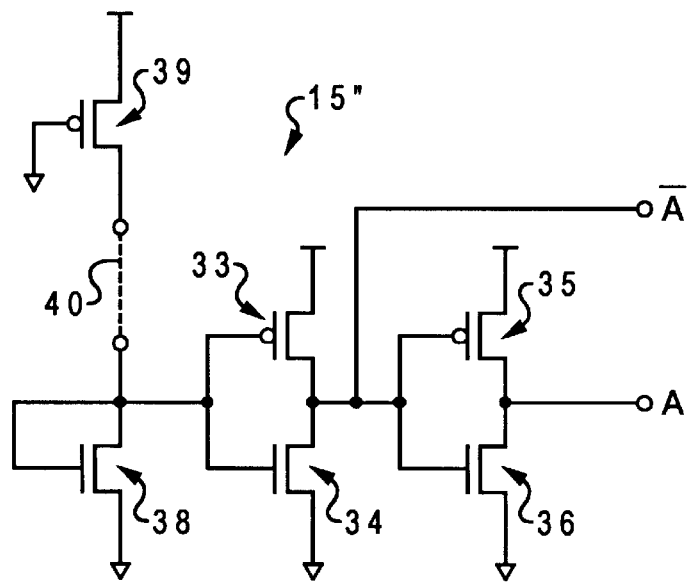
FIG. 3c is a circuit diagram of the control circuit from FIG. 1, in accordance with a third embodiment of the present invention.

Control circuit 15 can be implemented using various circuit configurations. For example, a control circuit 15' in FIG. 3b includes transistors 33–36 and 37–38. Each of transistor pairs 33–34 and 35–36 is arranged in an inverter configuration. The threshold voltage of n-channel transistor 38 is close to zero. During normal operations, input A=0 and input $\overline{A}$=1. Both inputs A and $\overline{A}$ are utilized to control transistors 21, 22, respectively, of FIB device modification circuit 10 in FIG. 2a. During a FIB edit, a jumper 40 will be connected by a FIB deposit. Because the input to the inverter formed by transistors 33–34 is now connected to a power supply, thus, A=1 and $\overline{A}$=0. As another example, a control circuit 15" in FIG. 3c includes transistors 33–36 and 38–39. Each of transistor pairs 33–34 and 35–36 is arranged in an inverter configuration. The threshold voltage of n-channel transistor 38 is close to zero. During normal operations, input A=0 and input $\overline{A}$=1. Both inputs A and $\overline{A}$ are utilized to control transistors 21, 22, respectively, of FIB device modification circuit 10 shown in FIG. 2a. During a FIB edit, jumper 40 will be connected by a FIB probe. Because the input to the inverter formed by transistors 33–34 is now connected to the power supply, thus, A=1 and $\overline{A}$=0.

Figure 2B:
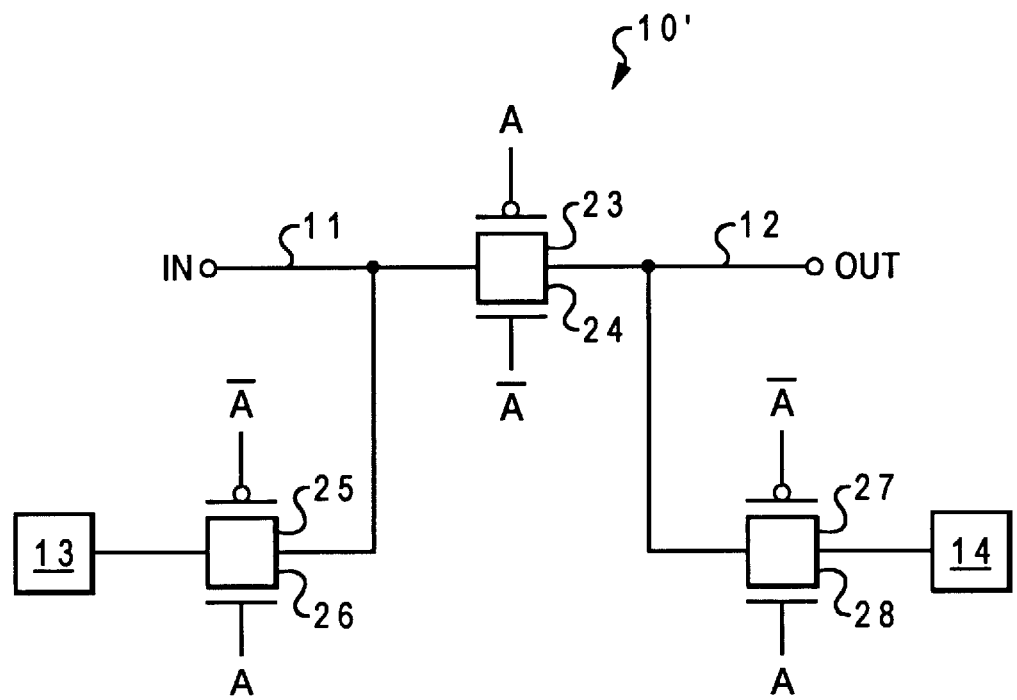
FIG. 2b is a circuit diagram of the FIB device modification circuit from FIG. 1, in accordance with a second embodiment of the present invention.

Similarly, FIB device modification circuit 10 from FIG. 2a can be implemented by other circuit configurations. For example, a FIB device modification circuit 10' in FIG. 2b includes transistor pairs 23–24, 25–26, and 27–28, each transistor pair arranged in a transmission gate configuration. Any of the control circuits shown in FIGS. 3a–3c may be utilized to control FIB device modification circuit 10'.

As has been described, the present invention provides an apparatus for assisting backside FIB device modification. The circuits shown in the present disclosure are presented as stand alone circuits that can be packaged as library circuit elements and/or explicitly included in a netlist. The circuits shown in the present disclosure can also be embedded in pre-existing functional circuit elements. For example, many latch circuits include transmission gate input stages for data (controlled by clock signals). Such circuits could be designed to include FIB editable structures, and could be incorporated into any circuit where the associated advantages can be realized.

Figure 4:
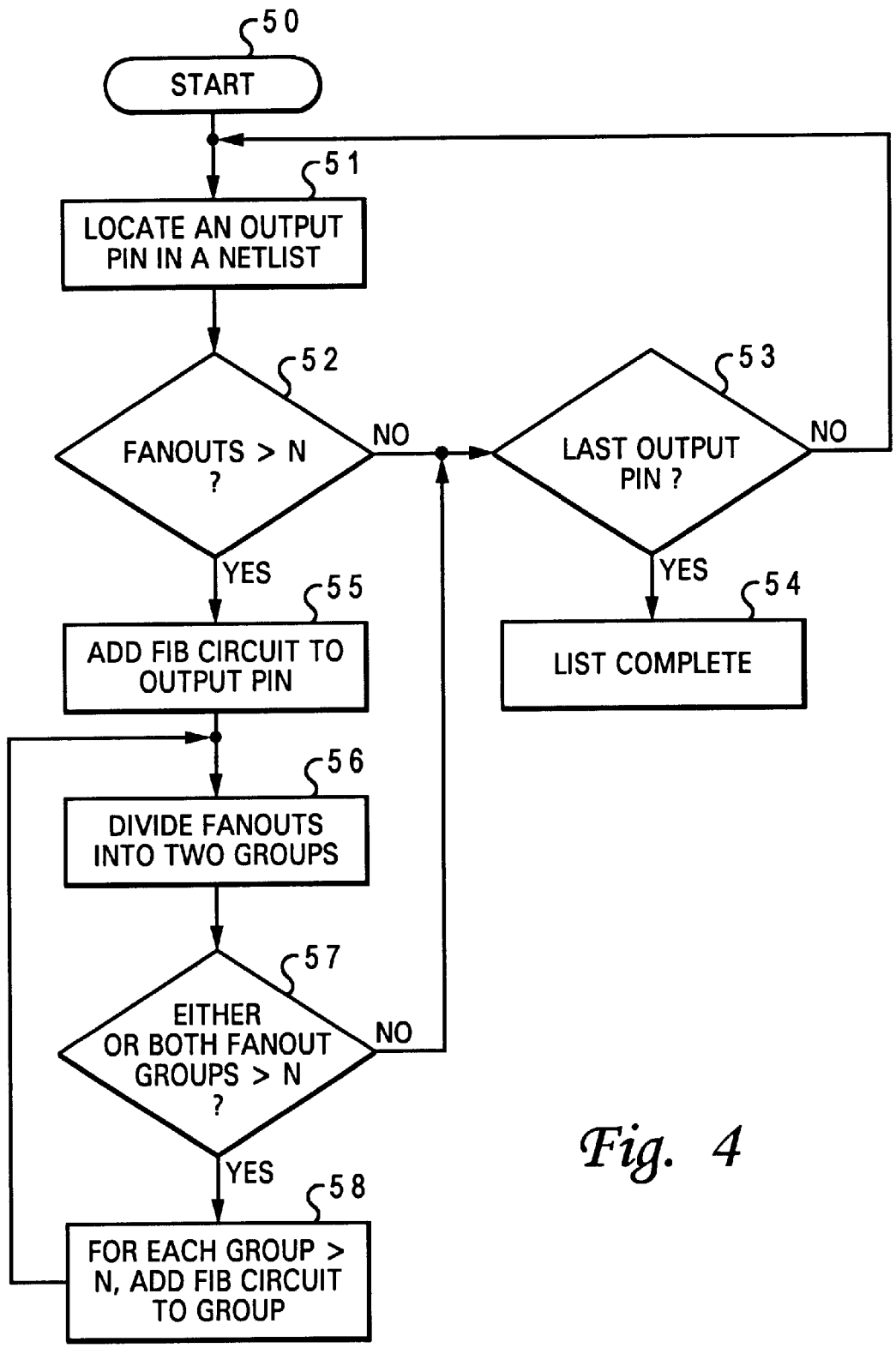
FIG. 4 is a high-level logic flow diagram of a method for inserting the apparatus for assisting backside FIB device modification from FIG. 1, in accordance with a preferred embodiment of the present invention.

With reference now to FIG. 4, there is illustrated a high-level logic synthesis flow diagram of a method for inserting the apparatus for assisting backside FIB device modification from FIG. 1 into a chip design, in accordance with a preferred embodiment of the present invention. Starting at block 50, an output pin is located in a netlist of a circuit, as shown in block 51. A determination is then made as to whether or not the number of fanouts at the output pin is greater than n, as depicted in block 52, where n is a whole number predetermined by a circuit designer. If the number of fanouts at the output pin is not greater than n, then another determination is made as to whether or not the output pin is the last output pin in the netlist, as illustrated in block 53. If that pin is the last output pin in the netlist, the list is completed, as shown in block 54; otherwise, the process proceeds back to block 51.

If the number of fanouts at the output pin is greater than n, a FIB circuit is then inserted at the output pin, as shown in block 55. Next, the fanouts at the output pin are divided into two groups, as depicted in block 56. A determination is then made as to whether or not the number of fanouts in each group is greater than n, as shown in block 57. If the number of fanouts in either one or both of the fanout groups is not greater than n, then the process proceeds back to block 53. Otherwise, if the number of fanouts in either one or both of the fanout groups is greater than n, a FIB circuit is inserted to each of the fanout groups, as illustrated in block 58. The division of each fanout group continues until none of the fanout group has a fanout number greater than n.

Figure 5:
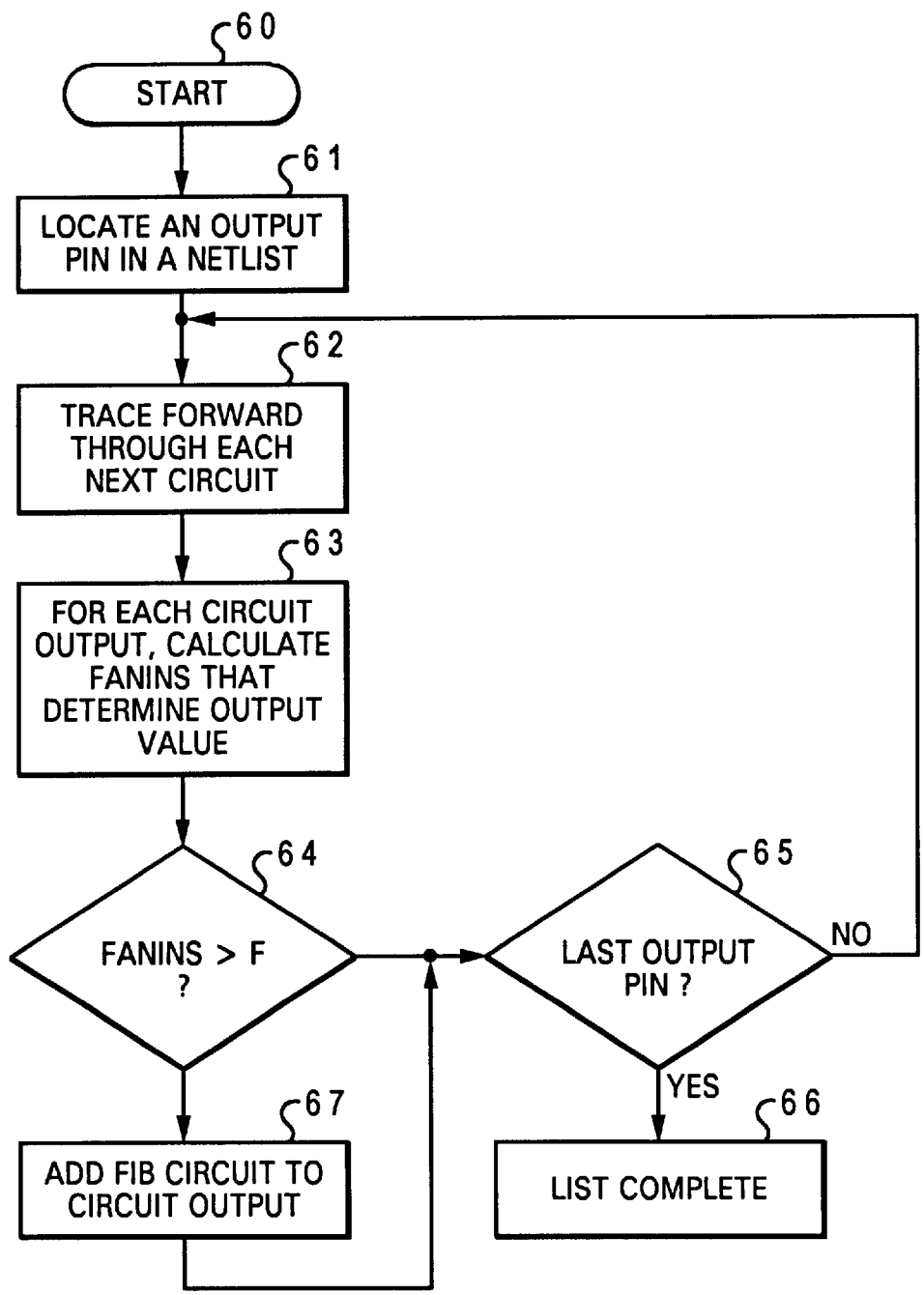
FIG. 5 is a high-level logic flow diagram of a method for inserting the apparatus for assisting backside FIB device modification from FIG. 1, in accordance with an alternative embodiment of the present invention.

Referring now to FIG. 5, there is illustrated a high-level logic synthesis flow diagram of a method for inserting the apparatus for assisting backside FIB device modification from FIG. 1 into a chip design, in accordance with an alternative embodiment of the present invention. Starting at block 60, an output pin is first located in a netlist of a circuit, as shown in block 61. The output pin is then traced forward through each next circuit, as depicted in block 62. For each output of the next traced circuit, the number of fan-ins is calculated, as illustrated in block 63. The number of fan-ins are the number of boolean inputs, which includes chip inputs or latch outputs or FIB insertion points, that determines the output value. For each fan-in pin, a determination is made as to whether or not the number of fin-ins is greater than f, as shown in block 64, where f is a whole number predetermined by a circuit designer. If the number of fin-ins is not greater than f, another determination is made as to whether or not that output pin is the last output pin in the netlist, as depicted in block 65. If that output pin is the last output pin in the netlist, then the list is completed, as depicted in block 66; otherwise, the process proceeds to block 62. If the number of fin-ins is greater than f, a FIB circuit is inserted at the output pin, as shown in block 67.

While the invention has been particularly shown and described with reference to a preferred embodiment, it will be understood by those skilled in the art that various changes in form and detail may be made therein without departing from the spirit and scope of the invention.

What is claimed is:

1. An apparatus for assisting backside focused ion beam (FIB) device modification, said apparatus comprising:

a FIB device modification circuit having an input and an output, wherein said FIB device modification circuit allows said input to be electrically connected to said output; and a FIB control circuit, coupled to said FIB device modification circuit, includes a FIB accessible structure located in a proximity of a backside of a substrate to allow said FIB accessible structure to be modified by a FIB machine to produce a jumper, wherein said control circuit includes a control line for controlling said FIB device modification circuit, wherein a state of said control line is altered when said jumper is connected by said FIB machine.

2. The apparatus of claim 1, wherein said FIB device modification circuit includes a FIB input pad and a FIB output pad.

3. The apparatus of claim 1, wherein said FIB device modification circuit includes at least one pass gate formed by two transistors.

4. The apparatus of claim 1, wherein said control circuit further includes at least an inverter circuit formed by two transistors.

5. An integrated circuit device comprising:

a plurality of circuits located on a substrate;

a focused ion beam (FIB) device modification circuit having an input and an output, wherein said FIB device modification circuit allows said input to be electrically connected to said output; and a FIB control circuit, coupled to said FIB device modification circuit, includes a FIB accessible structure located in a proximity of a backside of a substrate to allow said FIB accessible structure to be modified by a FIB machine to produce a jumper, wherein said control circuit includes a control line for controlling said FIB device modification circuit, wherein a state of said control line is altered when said jumper is connected by said FIB machine.

6. The integrated circuit device of claim 5, wherein said FIB device modification circuit includes a FIB input pad and a FIB output pad.

7. The integrated circuit device of claim 5, wherein said FIB device modification circuit includes at least one pass gate formed by two transistors.

8. The integrated circuit device of claim 5, wherein said control circuit further includes at least an inverter circuit formed by two transistors.

* * * * *